US010243091B2

(12) United States Patent
Dang et al.

(10) Patent No.: US 10,243,091 B2
(45) Date of Patent: Mar. 26, 2019

(54) DEVICE LAYER THIN-FILM TRANSFER TO THERMALLY CONDUCTIVE SUBSTRATE

(71) Applicant: International Business Machines Corporation, Armonk, NY (US)

(72) Inventors: Bing Dang, Chappaqua, NY (US); John U. Knickerbocker, Monroe, NY (US); Steven Lorenz Wright, Cortlandt Manor, NY (US); Cornelia Tsang Yang, Medford, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/944,222

(22) Filed: Apr. 3, 2018

(65) Prior Publication Data

US 2018/0226516 A1 Aug. 9, 2018

Related U.S. Application Data

(62) Division of application No. 14/974,643, filed on Dec. 18, 2015, now Pat. No. 10,032,943.

(51) Int. Cl.
*H01L 31/024* (2014.01)
*H01L 31/18* (2006.01)
*H01J 1/30* (2006.01)

(52) U.S. Cl.
CPC ............ *H01L 31/024* (2013.01); *H01J 1/30* (2013.01); *H01L 31/1892* (2013.01); *H01L 31/1896* (2013.01); *Y02E 10/50* (2013.01)

(58) Field of Classification Search
CPC ... H01L 31/024; H01L 31/18; H01L 31/1896; H01L 31/02
See application file for complete search history.

(56) References Cited

U.S. PATENT DOCUMENTS

| 5,391,257 | A | 2/1995 | Sullivan et al. |
|---|---|---|---|
| 8,273,610 | B2 | 9/2012 | Or-Bach et al. |
| 9,136,153 | B2 | 9/2015 | Or-Bach et al. |
| 10,032,943 | B2 * | 7/2018 | Dang .................. H01J 1/30 |
| 2003/0064535 | A1 | 4/2003 | Kub et al. |
| 2014/0264374 | A1 | 9/2014 | Hecht et al. |
| 2015/0035173 | A1 | 2/2015 | Dang et al. |
| 2015/0132924 | A1 | 5/2015 | Dang et al. |

OTHER PUBLICATIONS

Ex-Parte Quayle Office Action for U.S. Appl. No. 14/974,643 dated Mar. 9, 2018.
List of IBM Patents or Patent Applications Treated as Related.

* cited by examiner

*Primary Examiner* — Seahvosh Nikmanesh
(74) *Attorney, Agent, or Firm* — Fleit Gibbons Gutman Bongini Bianco PL; Jon A. Gibbons

(57) ABSTRACT

A semiconductor structure includes a thin-film device layer, an optoelectronic device disposed in the thin-film device layer, and a surrogate substrate permanently attached to the thin film device layer. The surrogate substrate is optically transparent and has a thermal conductivity of at least 300 W/m-K. The optoelectronic device excitable by visible light transmitted through the surrogate substrate.

10 Claims, 13 Drawing Sheets

DEVICE LAYER THIN-FILM TRANSFER TO THERMALLY CONDUCTIVE SUBSTRATE

FIELD OF THE INVENTION

The present invention generally relates to the field of semiconductors, and more particularly relates to wafer-to-wafer bonding.

BACKGROUND OF THE INVENTION

Silicon (Si) has an energy bandgap of about 1.1 eV and is not transparent in the visible light spectrum (wavelengths of about 500 nm to 800 nm). Certain microelectronic applications require a substrate that has high thermal conductivity, good optical transparency in the visible light spectrum and/or in the infrared light spectrum (wavelengths of about 1-10 µm), and, for many applications, also low electrical conductivity. Silicon carbide (hereinafter "SiC") is one material that can be used for such a substrate. Polytypes of SiC have energy bandgaps ranging from 2.4 eV to 3.2 eV, and, therefore, can operate at much higher temperatures than silicon. SiC is nearly optically transparent for wavelengths of about 500 nm to 800 nm, and has a thermal conductivity of about 450 W/m-K which is about three times greater than that of silicon. SiC has mechanical strength and moderately low electrical conductivity. However, there are high component material costs associated with SiC. Presently, SiC wafers are available in a size of 150 mm diameter, but SiC wafers are not available in any size larger than 150 mm diameter. However, it is preferred to support large quantities of dies by fabricating dies on larger diameter wafers, such as 200 mm or 300 mm diameter wafers. Furthermore, presently, fabrication tools for photolithography, deposition, etching, etc., are geared for 200 mm or 300 mm diameter wafers. Not only does the scaling increase quantity and reduce cost per component, but also 200 mm/300 mm fabrication tools are able to achieve improved yields and complexity of technology. A solution is needed to work around the limitations of the 150 mm diameter of SiC wafers.

SUMMARY OF THE INVENTION

In one embodiment, a semiconductor structure is disclosed. The semiconductor structure comprises a thin-film device layer and an optoelectronic device disposed in the thin-film device layer. The optoelectronic device is excitable by light at an application wavelength. The semiconductor structure also comprises a surrogate substrate permanently attached to the thin film device layer. The surrogate substrate is optically transparent at the application wavelength and has a thermal conductivity of at least 300 W/m-K.

In still another embodiment, a semiconductor structure is disclosed. The semiconductor structure comprises a thin-film device layer and an optoelectronic device disposed in the thin-film device layer. The optoelectronic device is excitable by light at an application wavelength. The semiconductor structure also comprises a surrogate substrate permanently attached to the thin film device layer, wherein the surrogate substrate has a volume of substrate removed therefrom to form a via. The via is aligned with a location of the optoelectronic device, and a cross-sectional area of the via is about equal to an active area of the optoelectronic device. A depth of the via is substantially less than a thickness of the surrogate substrate, wherein the light passes through the via and at least some of the surrogate substrate prior to reaching the optoelectronic device.

BRIEF DESCRIPTION OF THE DRAWINGS

The accompanying figures, where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
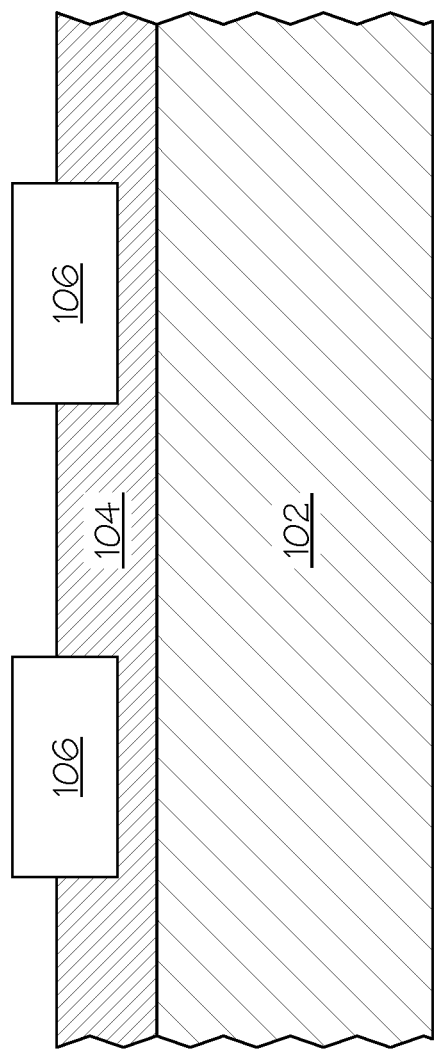
FIG. 1 is a schematic sectional view of a step in manufacturing a semiconductor structure, illustrating a substrate, an epitaxial layer and microelectronic devices.

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Presently, 200 mm and larger SiC wafers are not available at all or not available at a cost that could support targeted equipment form factor with respect to cost and product build efficiency. However, certain applications may call for SiC wafers for transparency at certain wavelengths accompanied by good thermal conductivity.

This disclosure describes transferring of a device layer from a substrate on which it was fabricated to another substrate. This disclosure describes transferring of a device layer from a substrate that has poor thermal conductivity to a substrate that has good thermal conductivity. The method and apparatus in accordance with the invention are appropriate for applications requiring a substrate with high thermal conductivity and optical transparency. This disclosure describes transferring of a device layer to a substrate that has good thermal conductivity and is optically transparent at wavelengths of light appropriate for a device in the device layer.

In accordance with the invention, one or more microelectronic devices are fabricated in a device layer on a wafer larger than 150 mm and then the device layer is transferred to another substrate (hereinafter "surrogate substrate") that meets optical, thermal, mechanical and electrical properties required by an application. This provides a path to process that maximizes use of 200 mm or 300 mm fabrication tools and minimizes use of 150 mm process tools, thereby reducing cost.

In one embodiment, the surrogate substrate is SiC. SiC has desired thermal, mechanical and electrical properties, is commercially available in 150 mm diameter wafers.

Presently, 200 mm wafers with SiC grown epitaxially on silicon (111) wafers are available on the market. In order to accommodate applications that require an optically-transparent and thermally-conductive substrate, 200 mm silicon wafers with a SiC epitaxial layer are used to build thin-film devices. Then, a 200 mm wafer that includes the device layer thin-film is cut down to 150 mm diameter and attached to a readily available 150 mm diameter SiC surrogate wafer or to a 150 mm surrogate substrate of another material that meets application requirement.

In one foreseeable method, when a 200 mm wafer of a material having properties capable of supporting a targeted application becomes commercially available, the SiC epitaxial device layer thin-film will be built on a 200 mm silicon substrate, and then the full 200 mm SiC epitaxial device layer thin-film would be transferred to such a 200 mm wafer that has the properties capable of supporting a targeted application.

Other surrogate substrate candidates include diamond, sapphire ($Al_2O_3$), zinc oxide (ZnO), magnesium oxide (MgO) and polycrystalline SiC. Diamond is optically transparent and has a higher thermal conductivity than SiC, but diamond is very expensive. Sapphire is optically transparent but has about one-tenth the thermal conductivity of SiC. The largest commercially available wafers of zinc oxide and magnesium oxide available at present have a size of about 100 mm diameter. Polycrystalline SiC has acceptable thermal conductivity, is less expensive than SiC, but is not very transparent. Still other surrogate substrate candidates include hybrid integrated substrates such as a substrate comprising a diamond film of about 20 μm thickness deposited over another material. Additional surrogate substrate candidates include another material having moderate optical transparency with an optical via that extends partly through such surrogate substrate to compensate for the less-than-ideal optical transparency of such material. Still other surrogate substrate candidates include one of the aforementioned materials with an epitaxial layer of SiC on the surface of the surrogate substrate that bonds with the device layer thin-film.

FIGS. 1-7 illustrate a manufacturing process for fabricating a semiconductor structure 701 (see FIG. 7) in accordance with the invention.

FIG. 1 is a schematic sectional view of a step in manufacturing the semiconductor structure 701, illustrating a substrate 102, an epitaxial layer 104 and at least one microelectronic device such as an optoelectronic device 106. In one embodiment, the substrate 102 is a silicon substrate. The optoelectronic device 106 is built in the epitaxial layer 104 which is, therefore, a device layer thin-film.

Figure 2:
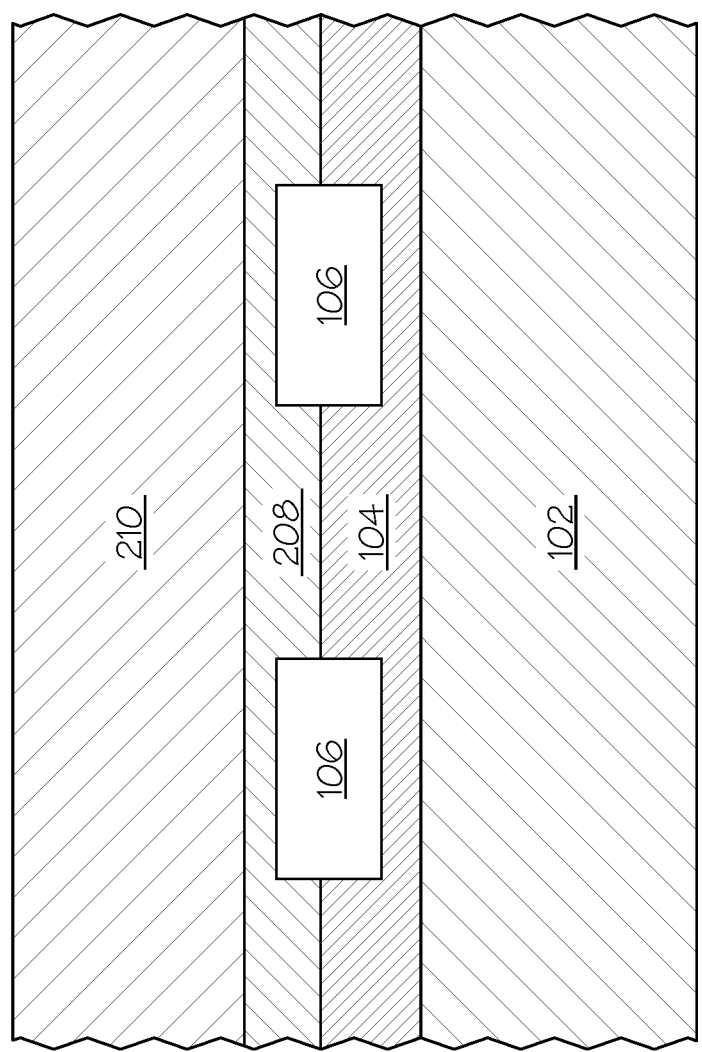
FIG. 2 is a schematic sectional view of another step in manufacturing the semiconductor structure, illustrating the semiconductor structure of FIG. 1, and including a removable/degradable adhesive and a handler attached to the epitaxial layer.

FIG. 2 is a schematic sectional view of another step in manufacturing the semiconductor structure 701, illustrating the semiconductor structure of FIG. 1, and including a silicon or glass handler (hereinafter "handler") 210 attached to the epitaxial layer 104 by a removable/degradable adhesive 208. The removable/degradable adhesive 208 is an inexpensive, low-temperature adhesive, thereby reducing risk of any damage to the epitaxial layer 104 from excessive heat. Examples of inexpensive, low-temperature adhesives are polyimide thermal plastic (semi-transparent), acrylic-based material (transparent), epoxy-type resist, benzocyclobutene ($C_8H_8$) thermoset, silicon-based materials, and low-melting point solder metals.

Figure 3:
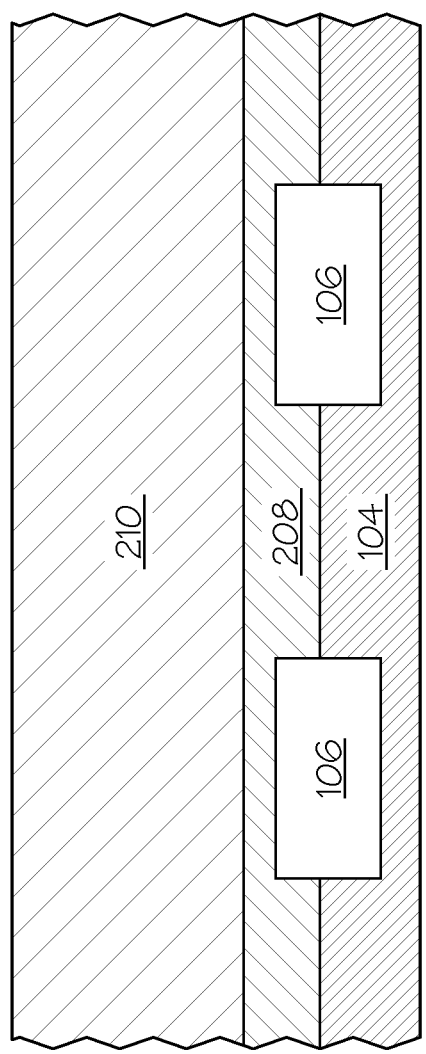
FIG. 3 is a schematic sectional view of another step in manufacturing the semiconductor structure, illustrating the semiconductor structure of FIG. 2 with the substrate removed.

FIG. 3 is a schematic sectional view of another step in manufacturing the semiconductor structure 701, illustrating the semiconductor structure of FIG. 2 except for the substrate 102 which has been removed. As explained hereinbelow, in some embodiments all or virtually all of the substrate 102 is removed, as shown in FIG. 3. In other embodiments (not shown), a small amount of the substrate 102 is allowed to remain.

Figure 4:
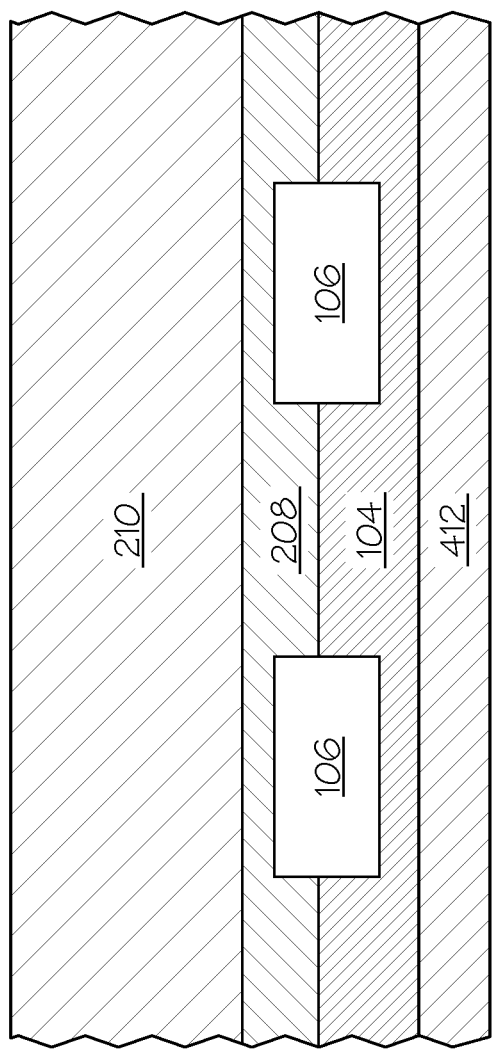
FIG. 4 is a schematic sectional view of another step in manufacturing the semiconductor structure, illustrating the semiconductor structure of FIG. 3, and including a polymeric thermal interface material or a thermally conductive adhesive applied to the epitaxial layer.

FIG. 4 is a schematic sectional view of another step in manufacturing the semiconductor structure 701, illustrating the intermediate semiconductor structure of FIG. 3, and including a permanent adhesive (hereinafter "adhesive") 412 applied to the epitaxial layer 104.

Figure 5:
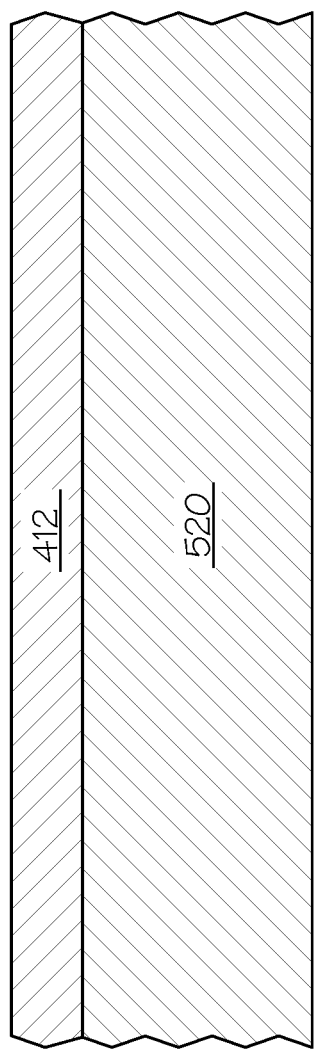
FIG. 5 is a schematic sectional view of another step in manufacturing the semiconductor structure, illustrating the polymeric thermal interface material or the thermally conductive adhesive of FIG. 4 applied to a surrogate substrate instead of being applied to the substrate.

FIG. 5 is a schematic sectional view of another step in manufacturing the semiconductor structure 701, illustrating a surrogate substrate 520. FIG. 5 illustrates that the adhesive 412 can be applied to the surrogate substrate 520 instead of being applied to the epitaxial layer 104. In one embodiment, the surrogate substrate 520 is sapphire. SiC has about ten times the thermal conductivity of sapphire. In another embodiment, the surrogate substrate 520 is sapphire with an epitaxial layer of SiC (not shown in FIG. 5). There is a limit to the thickness of an epitaxial layer of SiC on a lattice-mismatched substrate before the epitaxial layer of SiC mechanically cracks, thus limiting thermal conduction. However, if two epitaxial layers of SiC in contact with each other are utilized, the thermal conduction can be increased. After joining the epitaxial layer of SiC on the surrogate substrate 520 with the device epitaxial layer 104, there are now advantageously two epitaxial-layer thicknesses of SiC to dissipate heat from the optoelectronic device 106. In yet another embodiment, the surrogate substrate 520 is SiC without any particular epitaxial layer.

Figure 6:
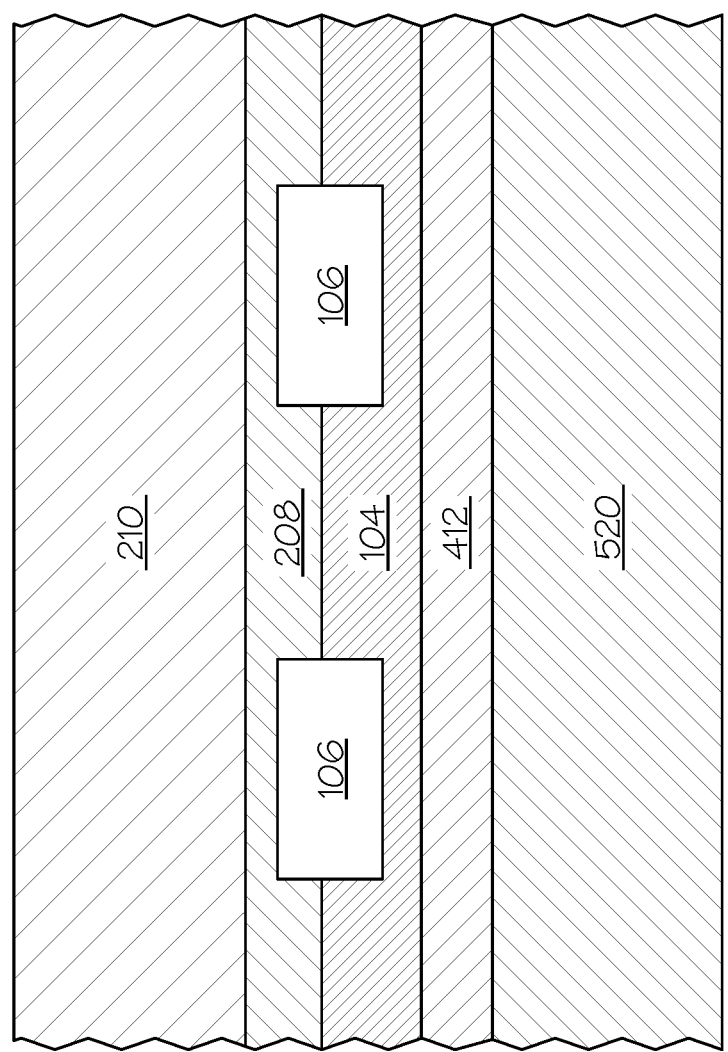
FIG. 6 is a schematic sectional view of another step in manufacturing the semiconductor structure, illustrating the epitaxial layer side of the semiconductor structure shown in FIG. 4 being bonded to a surrogate substrate.

FIG. 6 is a schematic sectional view of another step in manufacturing the semiconductor structure 701, illustrating the epitaxial layer 104 of the intermediate semiconductor structure shown in FIG. 4 after having been permanently bonded to the surrogate substrate 520 using the adhesive 412. The adhesive 412 is one of 1) polymeric thermal interface materials, 2) thermally conductive adhesives such as polyimide with aluminum nitride (AlN) nanoparticles etc., or 3) certain types of metals. The polymeric thermal interface materials are optically transparent in the application wavelength and have good thermal conductivity. The metals that can be used for bonding are transparent in the application wavelength, are thermally conductive, and are so thin (nm range) to be effectively transparent for the application wavelength.

Figure 7:
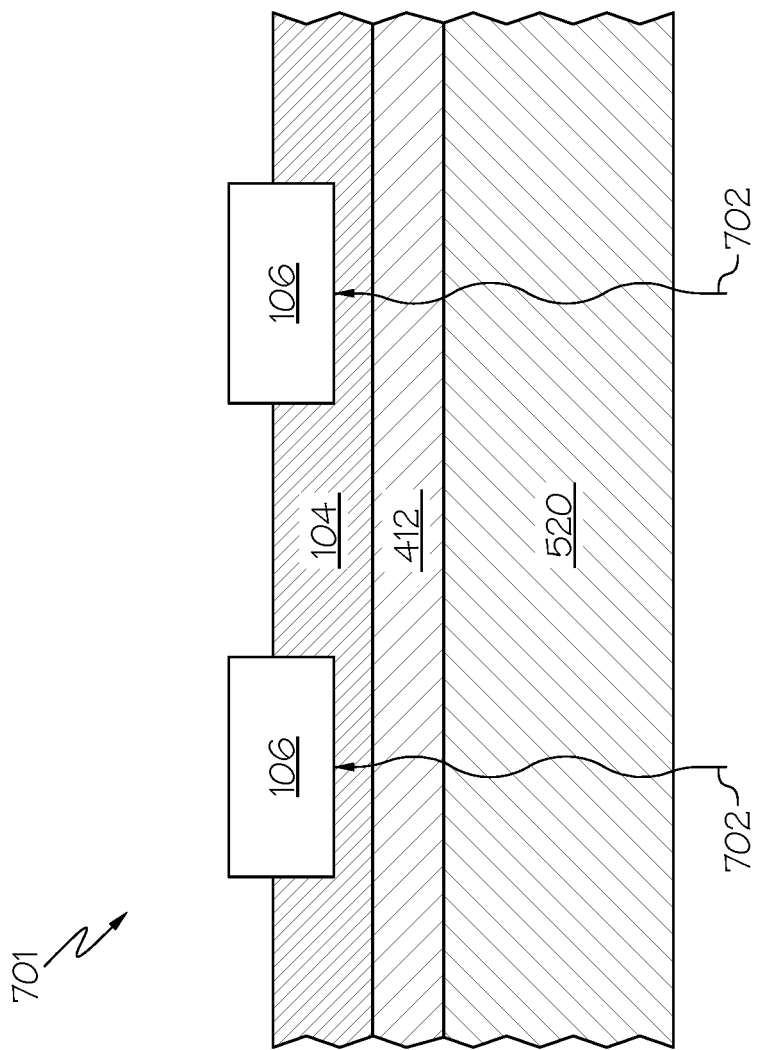
FIG. 7 is a schematic sectional view of another step in manufacturing the semiconductor structure, illustrating the semiconductor structure shown in FIG. 6 with the removable/degradable adhesive and the handler removed.

FIG. 7 is a schematic sectional view of another step in manufacturing the semiconductor structure 701, illustrating the intermediate semiconductor structure shown in FIG. 6 except that the removable/degradable adhesive 208 and the handler 210 have been removed.

The method and apparatus in accordance with the invention is particularly appropriate when the at least one microelectronic device is an optoelectronic device 106. One exemplary optoelectronic device 106 includes a photo-emissive layer that emits electrons when the photo-emissive layer is excited by light. In FIG. 7, the excitation light is illustrated by the symbol 702. The light acts as an input signal to the optoelectronic device 106. The light must penetrate the substrate so that the light can reach the optoelectronic device 106, i.e., a sufficient portion of the light must be transmitted through the substrate and not be reflected by the substrate or absorbed by the substrate. Very little visible light is transmitted through silicon. This is a reason for removing a substrate of silicon on which the epitaxial layer 104 was grown and for transferring the remaining epitaxial layer (which is temporarily attached to the handler 210) to a surrogate substrate of another material that has good optical transparency. However, some infrared light can be transmitted through silicon. For an optoelectronic device 106 that can be excited by infrared light, as much as 50 µm of silicon can remain attached to the epitaxial layer 104 when the silicon substrate is removed. The optoelectronic device 106 generates heat when it emits electrons, and the heat needs to be removed through a substrate. This is a reason for needing a surrogate substrate having good thermal conductivity. A surrogate substrate that has a large energy bandgap, such as SiC, is advantageous in applications where the semiconductor structure 701 generates significant heat during operation. Some optoelectronic devices 106 include a volume under vacuum. The vacuum causes about 14 psi of pressure to exist around the periphery of the volume. This is a reason for needing a surrogate substrate having adequate mechanical strength to support high stress caused by the volume under vacuum. With the semiconductor structure 701, light passes through the surrogate substrate 520, through the adhesive 412 and through the epitaxial layer 104, so as to reach the optoelectronic device 106.

Figure 8:
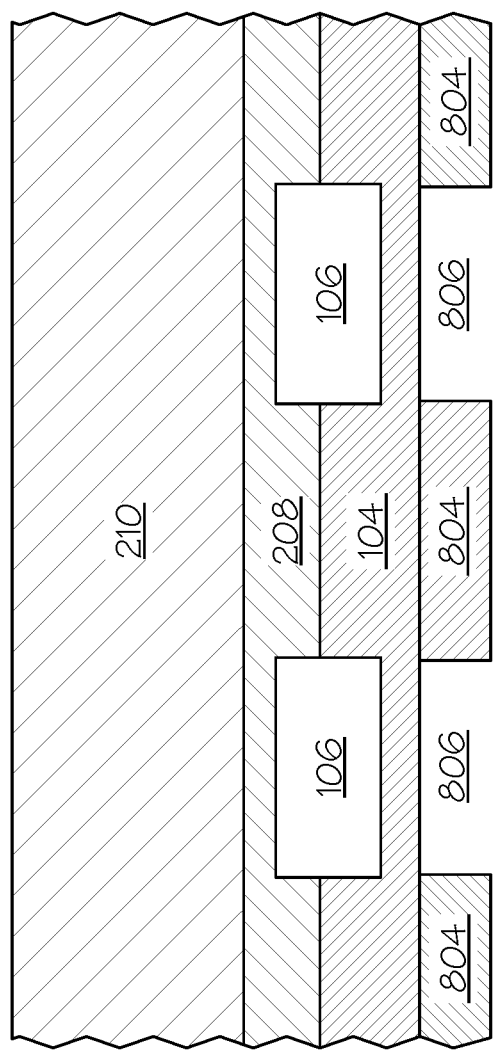
FIG. 8 is a schematic sectional view of another step in manufacturing a second semiconductor structure in accordance with another embodiment of the invention, illustrating the semiconductor structure shown in FIG. 3, and including a metal interlayer bonded to the epitaxial layer.
Figure 9:
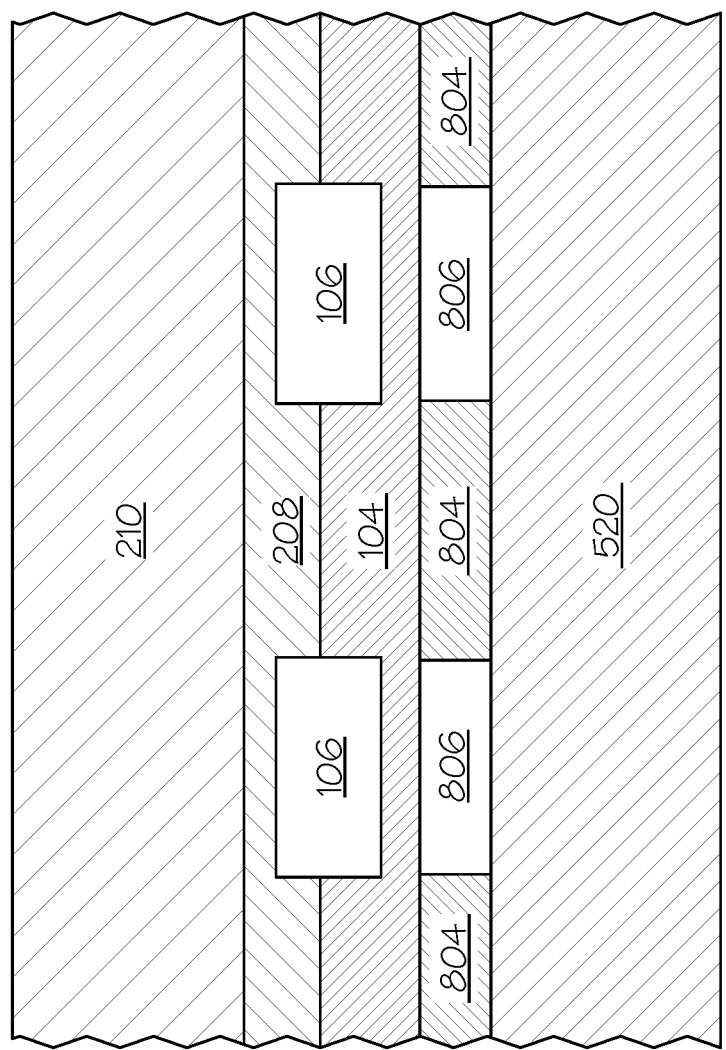
FIG. 9 is a schematic sectional view of another step in manufacturing the second semiconductor structure, illustrating the semiconductor structure shown in FIG. 8, and including a surrogate substrate bonded to the metal interlayer.
Figure 10:
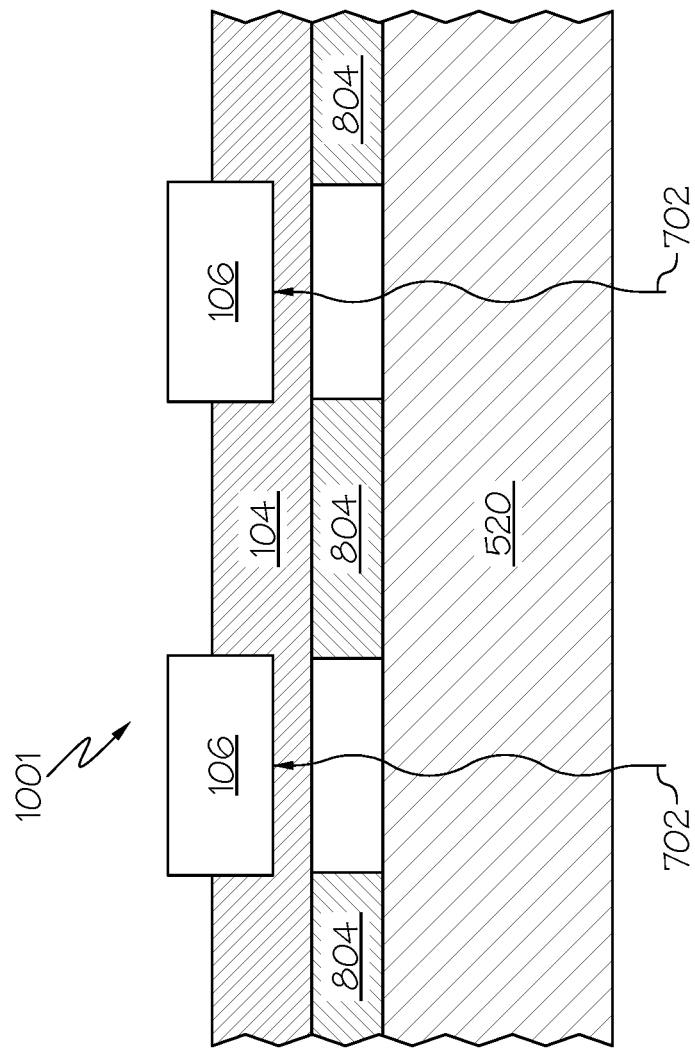
FIG. 10 is a schematic sectional view of another step in manufacturing the second semiconductor structure, illustrating the semiconductor structure shown in FIG. 9 with the removable/degradable adhesive and the silicon or glass handler removed.

FIGS. 8-10 illustrate a manufacturing process for fabricating a semiconductor structure 1001 (see FIG. 10) in accordance with another embodiment the invention. FIG. 8 is a schematic sectional view of a step in manufacturing the semiconductor structure 1001, illustrating the intermediate semiconductor structure shown in FIG. 3, and including a metal interlayer 804 bonded to the epitaxial layer 104. The metal interlayer 804 includes an optical via 806 aligned with each optoelectronic device 106. In one embodiment, the metal interlayer 804 is deposited onto the epitaxial layer 104 by evaporation or by sputtering. Titanium (Ti) and gold (Au) are examples of the metals used to form the metal interlayer 804. In other embodiments, other metals are plated onto the epitaxial layer to form the metal interlayer 804.

FIG. 9 is a schematic sectional view of another step in manufacturing the semiconductor structure 1001, illustrating the intermediate semiconductor structure shown in FIG. 8, and including the surrogate substrate 520 bonded to the metal interlayer 804. Prior to the surrogate substrate 520 and the metal interlayer 804 being bonded together, a thin layer of Ti (not shown) is sputtered onto the surface of the surrogate substrate that is to be bonded to the metal interlayer. The thin layer of Ti is then followed by a thicker layer of a second metal (not shown). For example, one of gold and indium (In) are used for the second metal, depending on a maximum temperature allowed for joining.

FIG. 10 is a schematic sectional view of another step in manufacturing the semiconductor structure 1001, illustrating the intermediate semiconductor structure shown in FIG. 9 except that the removable/degradable adhesive 208 and the handler 210 have been removed. FIG. 10 illustrates light by the symbol 702. The light is generated by a laser (not shown). With the semiconductor structure 1001, light passes through the surrogate substrate 520, through the vias 806 of the metal interlayer 804, and through the epitaxial layer 104, so as to reach the optoelectronic device 106.

Figure 11:
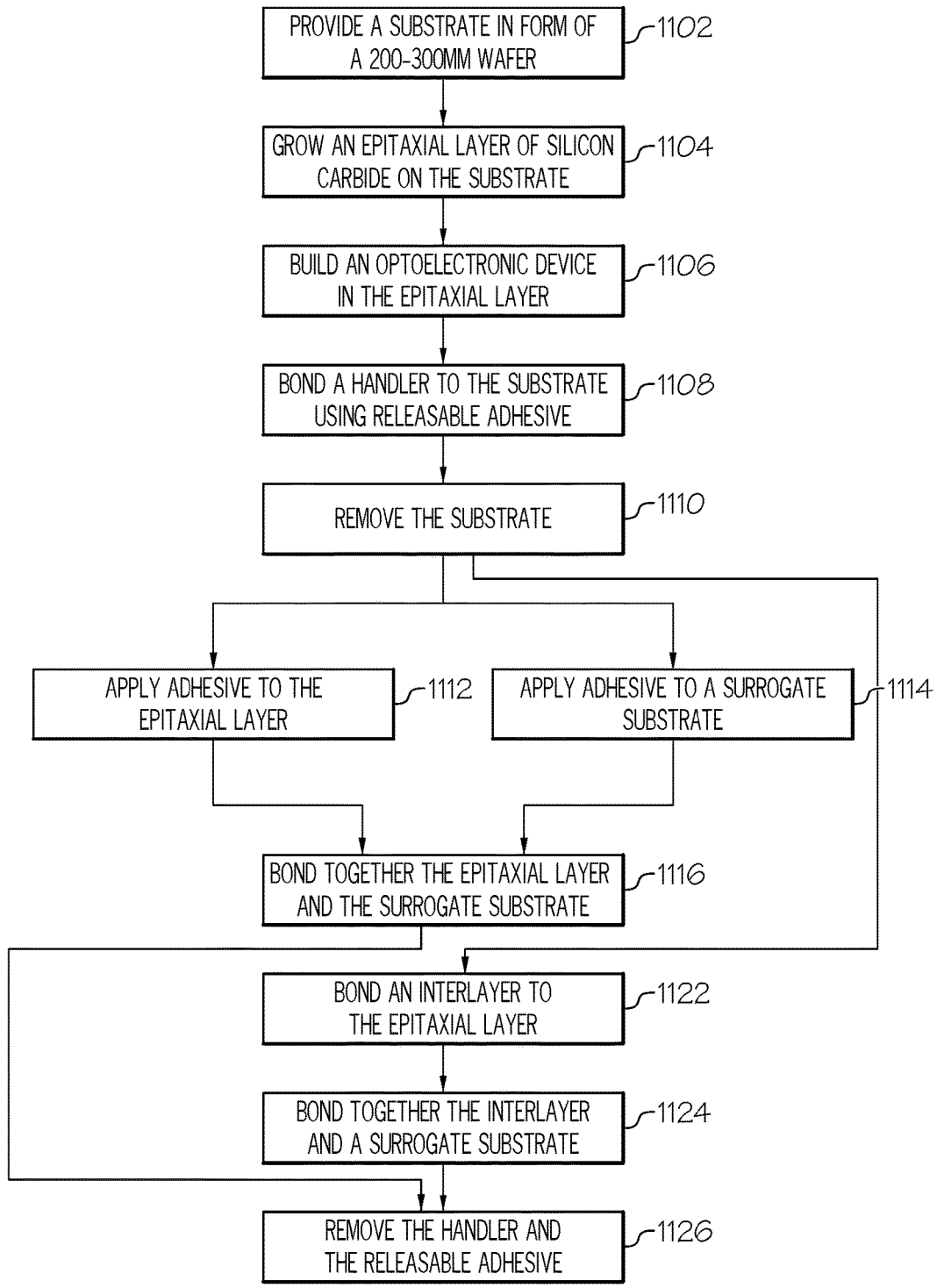
FIG. 11 is a flow diagram of a method of fabricating semiconductor structures in accordance with the invention.

FIG. 11 is a flow diagram of a method of fabricating the semiconductor structures 701 and 1001.

Step 1102: Provide a substrate 102 in the form of a 200-300 mm wafer that has a thickness of 720-730 µm. The substrate 102 is silicon or another suitable material. Advantageously, a silicon wafer is relatively inexpensive compared to a SiC wafer or to wafers of other materials, and conventional 200-300 mm fabrication tools can be advantageously used.

Step 1104. Grow an epitaxial layer 104 of SiC or another suitable material that is optically transparent and thermally conductive on the substrate 102. The epitaxial layer 104 is 2-5 µm thick. Crystal quality problem may arise if the epitaxial layer 104 is thicker than 2-5 µm.

Step 1106: Build at least one optoelectronic device 106 in the epitaxial layer 104. The optoelectronic device 106 has an optical input and has significant power dissipation. The intermediate semiconductor structure that results after step 1106 is shown in FIG. 1.

In some embodiments of the method (not shown), the wafer of the substrate 102 is cored to a diameter of the wafer of the surrogate substrate 520. In one such embodiment, this includes a step of coring the 200 mm wafer down to 150 mm. When this optional step is performed, it is performed after the microelectronic devices in the epitaxial layer 104 are fabricated.

Step 1108: Temporarily attaching the substrate 102 to the handler 210 using the removable/degradable adhesive 208.

The intermediate semiconductor structure that results after step 1108 is shown in FIG. 2.

Step 1110: Remove all, or substantially thin, the substrate 102 by a combination of grinding, chemical-mechanical polishing and wet etching. For an optoelectronic device 106 that is excitable by an input signal of visible light, all 720-730 µm of the substrate is removed. For an optoelectronic device 106 that is excitable by an input signal of infrared light, all but 50 µm or less of the 720-730 µm of the substrate is removed. The intermediate semiconductor structure that results after step 1110 is shown in FIG. 3.

Step 1112: Apply the adhesive 412 to the epitaxial layer 104 while other side of epitaxial layer remains temporarily bonded to the handler 210. The intermediate semiconductor structure that results after step 1112 is shown in FIG. 4.

Step 1114 (which is alternatively performed instead of step 1112): Apply the adhesive 412 to the surrogate substrate 520. The intermediate semiconductor structure that results after step 1114 is shown in FIG. 5.

Step 1116 (which is performed after step 1112 or step 1114): Bond together the epitaxial layer 104 and the surrogate substrate 520 while other side of epitaxial layer 104 is temporarily bonded to the handler 210. The intermediate semiconductor structure that results after step 1116 is shown in FIG. 6.

In embodiments of the method in which the 200 mm/300 mm wafer of the substrate 102 is not cored down to 150 mm, prior to the step of bonding the epitaxial layer 104 to the surrogate substrate 520, the 150 mm surrogate substrate is placed in a pocket of a 200 mm handler wafer (not shown).

Step 1126: Remove the handler 210 and the removable/degradable adhesive 208 from the intermediate semiconductor structure formed as a result of performing step 1116. In one embodiment, the removable/degradable adhesive 208 is releasable by using light from 308 nm or a 355 nm laser. The semiconductor structure 701 that results after performing step 1126 is shown in FIG. 7. The semiconductor structure 701 enables the input light signal to reach the optoelectronic device 106, and the surrogate substrate 520 provides sufficient thermal conduction to dissipate heat generated by the optoelectronic device (along with a small amount of heat caused by a portion of the input light signal being absorbed by the surrogate substrate).

Instead of performing step 1116 and one of step 1112 and 1114 after performing step 1110, steps 1122 and 1124 are performed after performing step 1110.

Step 1122: Use the interlayer 804, which has the desired thermal, electrical and mechanical properties needed for a surrogate substrate, but is not optically transparent. In step 1122, the interlayer 804 is bonded to the intermediate semiconductor structure formed after step 1110 and shown in FIG. 3, thereby producing the intermediate semiconductor structure shown in FIG. 8. Because the interlayer 804 is not optically transparent, the interlayer 804 is patterned such that some material of the interlayer is removed, thereby forming the optical via 806, at a location aligned with the location of the optoelectronic device 106. A diameter of the optical via 806 is selected so that an area of the optical via is about equal to the active area of the optoelectronic device 106. The diameter of the optical via 806 is at least 1 µm. In one embodiment, the active area of the optoelectronic device 106 is about 1000 µm. In such embodiment, the diameter of the optical via 806 can be as large as about 35 µm. In one embodiment, the interlayer 804 is silicon. In another embodiment, the interlayer 804 is metal.

Step 1124: Bond the interlayer 804 of the intermediate semiconductor structure formed by step 1122 (see FIG. 8) to the surrogate substrate 520. The surface of the interlayer 804 and the surrogate substrate 520 are coated with titanium or other metal, followed by a second metal for metal-to-metal bond to the adjoining surface. The intermediate semiconductor structure that results after step 1124 is shown in FIG. 9.

Step 1126: Remove the handler 210 and the removable/degradable adhesive 208 from the intermediate semiconductor structure formed by step 1124 (see FIG. 9), thereby producing the semiconductor structure 1001 shown in FIG. 10. The semiconductor structure 1001 enables input light to reach the optoelectronic device 106 and provides thermal conduction for dissipating heat caused by operation of the optoelectronic device.

Figure 12:
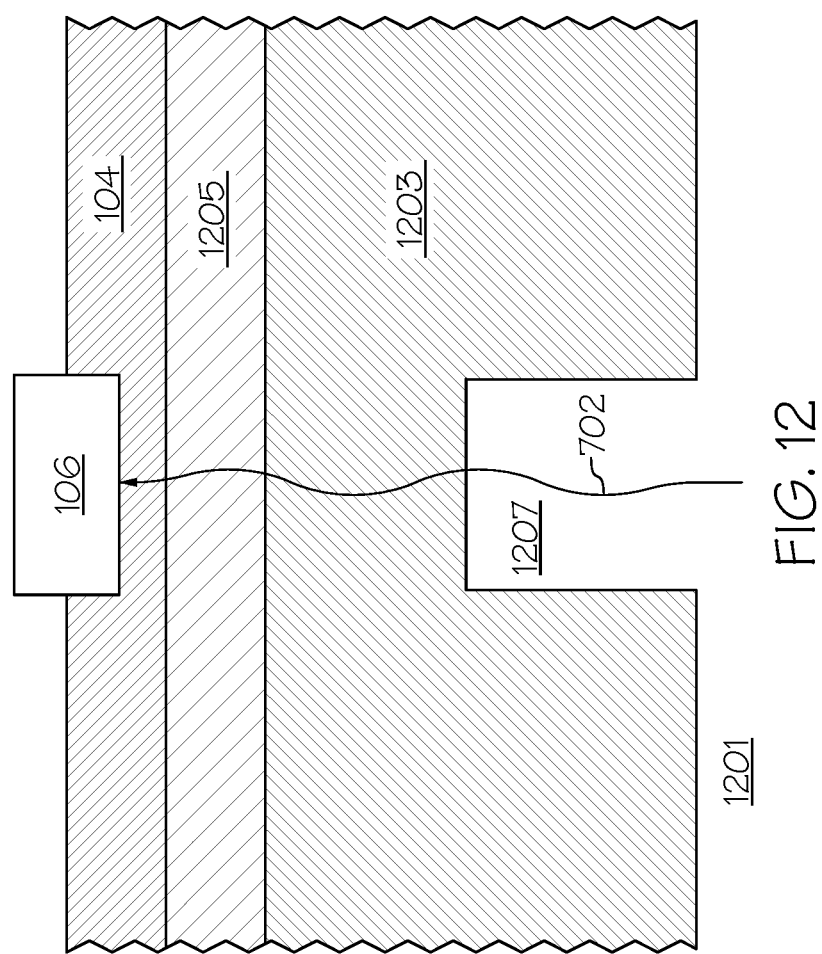
FIG. 12 is a schematic sectional view of a third semiconductor structure in accordance with still another embodiment of the invention.

FIG. 12 is a schematic sectional view of a semiconductor structure 1201 in accordance with still another embodiment of the invention. The semiconductor structure 1201 includes a surrogate substrate 1203. In one embodiment, the surrogate substrate 1203 is silicon and the surrogate substrate has an epitaxial layer 1205 of SiC. A volume of the silicon of the surrogate substrate has been removed to form a via 1207. A location of the via 1207 is selected to align with a location of the optoelectronic device 106 to facilitate light reaching the optoelectronic device. A diameter of the via 1207 is selected so that an area of the via is about equal to the active area of the optoelectronic device 106. A depth of the via 1207 is almost as much as a thickness of the silicon of the surrogate substrate 1203. The via 1207 could be formed using wet chemical etchants including those which anisotropically etch silicon, or by reactive-ion etching. Depending upon the material of the surrogate substrate 1203 and the wavelength of light, the thickness of the surrogate substrate between the via 1207 and the epitaxial layer 1205 needs to be at least a few micrometers.

Figure 13:
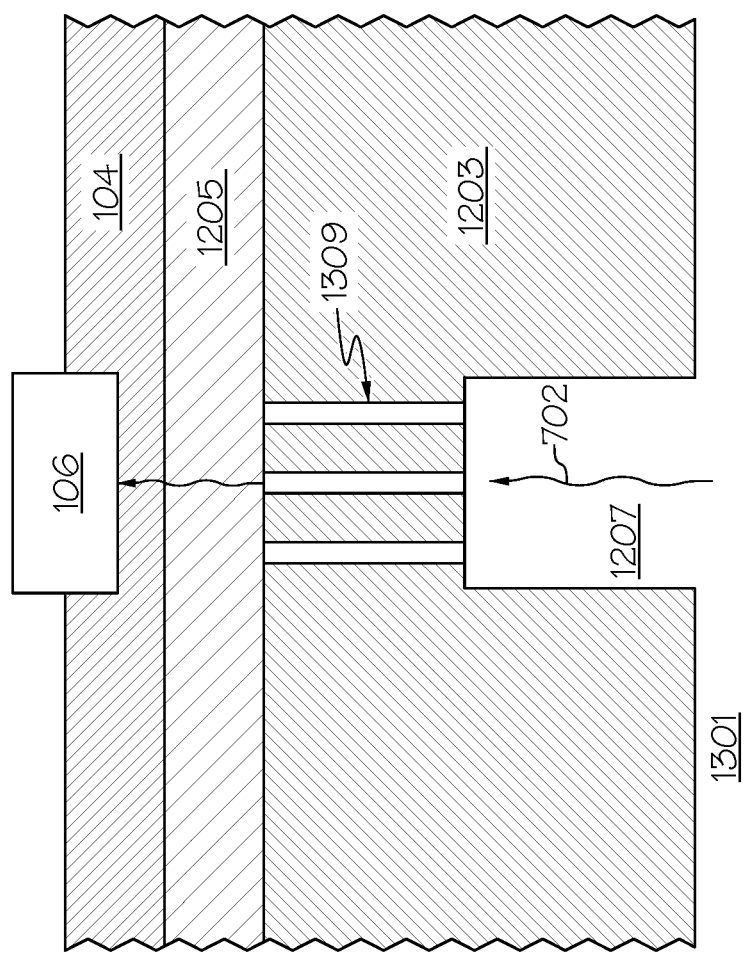
FIG. 13 is a schematic sectional view of a fourth semiconductor structure in accordance with yet another embodiment of the invention.

FIG. 13 is a schematic sectional view of a semiconductor structure 1301 in accordance with yet another embodiment of the invention. A volume of the silicon of the surrogate substrate has been removed to form a via 1207. A location of the via 1207 is selected to align with a location of the optoelectronic device 106 to facilitate light reaching the optoelectronic device. A diameter of the via 1207 is selected so that an area of the via is about equal to the active area of the optoelectronic device 106. A depth of the via 1207 is partially through a thickness of the silicon of the surrogate substrate 1203. The via 1207 could be formed using wet chemical etchants including those which anisotropically etch silicon, or by reactive-ion etching. The semiconductor structure 1301 includes a plurality of small vias 1309. The plurality of small vias 1309 are aligned with the via 1207. The small vias 1309 can be made by a Bosch deep reactive-ion etching process that can produce high-aspect ratio vias with nearly straight vertical walls. The Bosch process toggles between process gases, with sulfurhexafluoride ($SF_6$) utilized to etch silicon and octafluorocyclobutane ($C_4F_8$) to passivate the sidewall of the small vias 1309. Multiple small vias 1309 may be required to facilitate light transmission, while retaining mechanical strength. A combined depth of the large via 1207 and the small vias 1309 is equal to, or virtually equal to, the thickness of the surrogate substrate 1203. Because light passes through none, or virtually none, of the surrogate substrate 1203, even a greater amount of light reaches the optoelectronic device 106 with the semiconductor structure 1301 compared to the semiconductor substrate 1201.

Other embodiments can consist of multiple layers of thin-film devices transferred onto multiple bonding surfaces.

It should be noted that many optoelectronic devices cannot be tested while they are on a silicon substrate because light cannot pass through silicon. However, the method in accordance with the invention can be used when manufacturing other types of low yield devices that require a full SiC substrate and that can be tested while on a silicon wafer. The low yield devices are built in a SiC epitaxial layer on silicon wafers. Silicon wafers cost less than one-tenth as much as SiC wafers. The low-yield devices are tested while on the inexpensive silicon wafers. Only the silicon wafers that have many known-good devices are selected for transferring their SiC epitaxial layer to an expensive SiC wafer.

Non-Limiting Examples

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A semiconductor structure, comprising:
   a thin-film device layer;
   an optoelectronic device disposed in the thin-film device layer, the optoelectronic device excitable by light at an application wavelength; and
   a surrogate substrate permanently attached to the thin film device layer, wherein the surrogate substrate is optically transparent at the application wavelength and has a thermal conductivity of at least 300 W/m-K.

2. The semiconductor structure of claim 1, wherein the thin-film device layer is silicon carbide.

3. The semiconductor structure of claim 2, wherein the surrogate substrate is permanently attached to the thin film device layer by a polymeric thermal interface material that is optically transparent at the application wavelength and has a thermal conductivity of at least 300 W/m-K.

4. The semiconductor structure of claim 3, wherein the surrogate substrate is permanently attached to the thin film device layer by polyimide with aluminum nitride nanoparticles.

5. The semiconductor structure of claim 3, wherein the surrogate substrate is permanently attached to the thin film device layer by a layer of a metal, wherein the layer of the metal has a thickness such that the layer is effectively transparent at the application wavelength.

6. The semiconductor structure of claim 2, wherein the surrogate substrate is silicon carbide.

7. The semiconductor structure of claim 2, wherein the surrogate substrate is one of diamond, sapphire, zinc oxide, magnesium oxide and polycrystalline silicon carbide.

8. The semiconductor structure of claim 2, wherein surrogate substrate is one of diamond, sapphire, zinc oxide, magnesium oxide and polycrystalline silicon carbide with an epitaxial layer of silicon carbide on a surface of the surrogate substrate that bonds with the thin-film device layer.

9. The semiconductor structure of claim 2, wherein the surrogate substrate includes a via that extends at least partly through the surrogate substrate, wherein a location of the via in the surrogate substrate is selected to coincide with a location of the optoelectronic device in the thin-film device layer to facilitate light reaching the optoelectronic device.

10. The semiconductor structure of claim 1, wherein the application wavelength is between 500nm and 800nm.

* * * * *